(12) United States Patent
Tahara et al.

(10) Patent No.: US 11,404,283 B2
(45) Date of Patent: *Aug. 2, 2022

(54) ETCHING METHOD

(71) Applicant: TOKYO ELECTRON LIMITED, Tokyo (JP)

(72) Inventors: Shigeru Tahara, Miyagi (JP); Nobuaki Seki, Miyagi (JP); Takahiko Kato, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/013,252

(22) Filed: Sep. 4, 2020

(65) Prior Publication Data
US 2020/0402814 A1 Dec. 24, 2020

Related U.S. Application Data

(63) Continuation of application No. 16/360,469, filed on Mar. 21, 2019, now Pat. No. 10,770,308.

(30) Foreign Application Priority Data

Mar. 23, 2018 (JP) .............................. JP2018-056706

(51) Int. Cl.
*H01L 21/3213* (2006.01)
*H01L 21/321* (2006.01)
(Continued)

(52) U.S. Cl.
CPC ............ *H01L 21/32136* (2013.01); *H01J 37/32642* (2013.01); *H01J 37/32715* (2013.01);
(Continued)

(58) Field of Classification Search
None
See application file for complete search history.

(56) References Cited

U.S. PATENT DOCUMENTS

| 5,624,583 A | 4/1997 | Tokashiki et al. |
| 10,770,308 B2 * | 9/2020 | Tahara .............. H01J 37/32935 |

(Continued)

FOREIGN PATENT DOCUMENTS

JP 08-078396 A 3/1996

OTHER PUBLICATIONS

V.M. Donnelly and A. Kornblit, "Plasma etching: yesterday, today and tomorrow", J. Vac. Sci. Technol. A, vol. 31(5), p. 050825-1 to 050825-48. (Year: 2013).*

*Primary Examiner* — Jiong-Ping Lu
(74) *Attorney, Agent, or Firm* — Weihrouch IP

(57) ABSTRACT

A method for etching a ruthenium film includes a first step of etching the ruthenium film by plasma processing using oxygen-containing gas, and a second step of etching the ruthenium film by plasma processing using chlorine-containing gas. The first step and the second step are alternately performed. In the first step and the second step, the ruthenium film is etched at a target control temperature for a target processing time that are determined based on a pre-obtained relation between an etching amount per one cycle including the first step and the second step as a set, a control temperature of the ruthenium film, and processing times of each of the first step and the second step.

6 Claims, 16 Drawing Sheets

(51) Int. Cl.
    *H01J 37/32*         (2006.01)
    *H01L 21/67*         (2006.01)
    *H01L 21/683*       (2006.01)
    *H01L 21/311*       (2006.01)
    *H01L 21/3065*      (2006.01)
    *C23F 4/00*          (2006.01)

(52) U.S. Cl.
    CPC ............. *H01J 37/32724* (2013.01); *H01J 37/32935* (2013.01); *H01L 21/31116* (2013.01); *H01L 21/32115* (2013.01); *H01L 21/32138* (2013.01); *H01L 21/67109* (2013.01); *H01L 21/67248* (2013.01); *H01L 21/6831* (2013.01); *C23F 4/00* (2013.01); *H01L 21/3065* (2013.01)

(56) References Cited

U.S. PATENT DOCUMENTS

| | | | |
|---|---|---|---|
| 11,049,730 B2 * | 6/2021 | Nagatomo | H01L 22/26 |
| 2012/0231561 A1 * | 9/2012 | Dolan | H01L 21/02071 |
| | | | 438/14 |
| 2019/0103363 A1 * | 4/2019 | Yu | H01L 21/28568 |

* cited by examiner

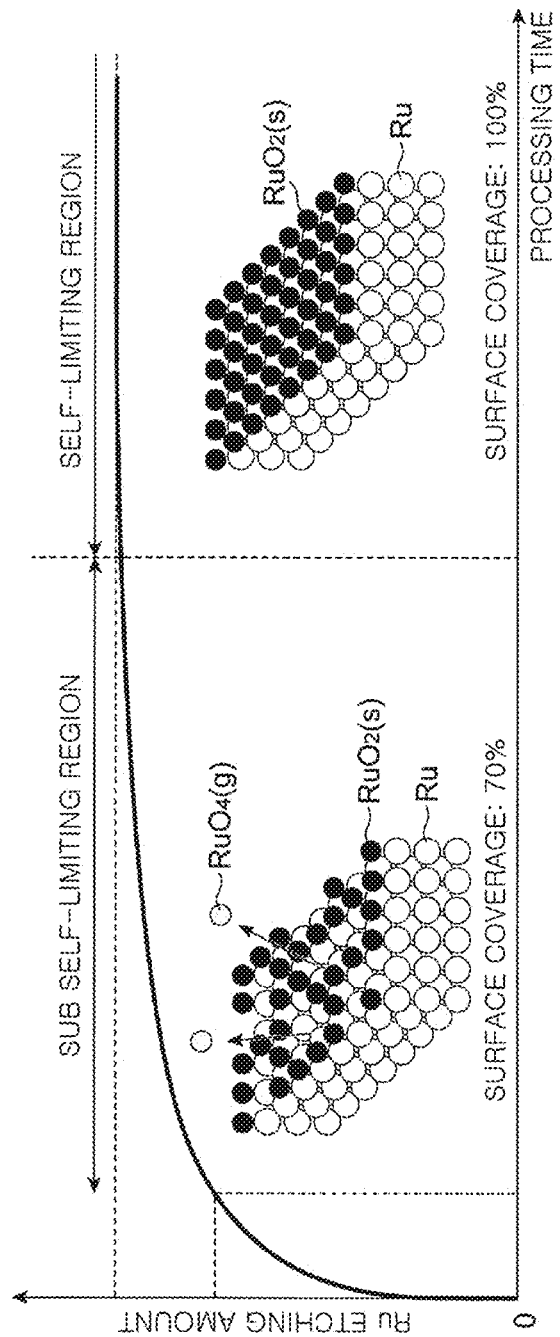

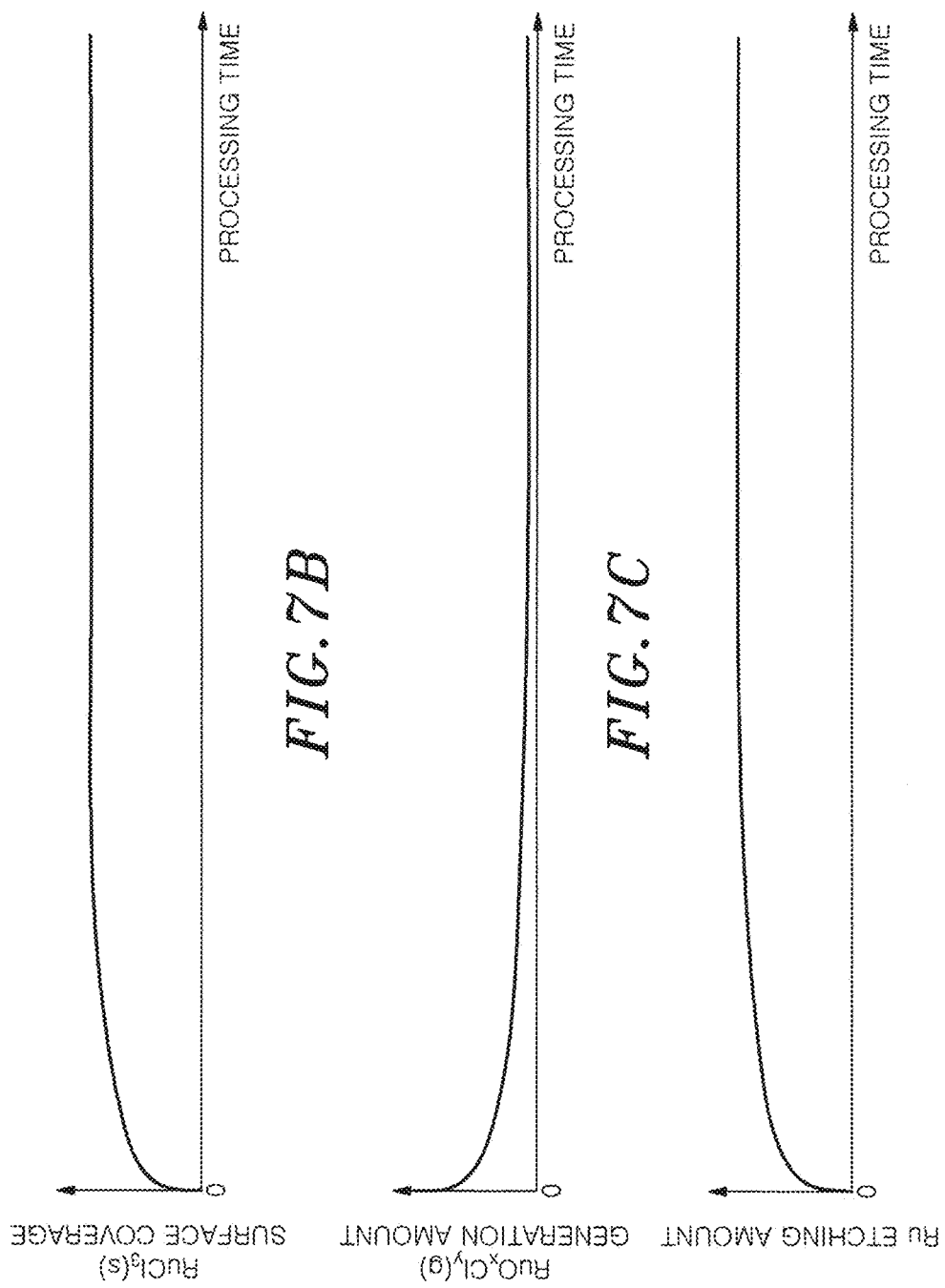

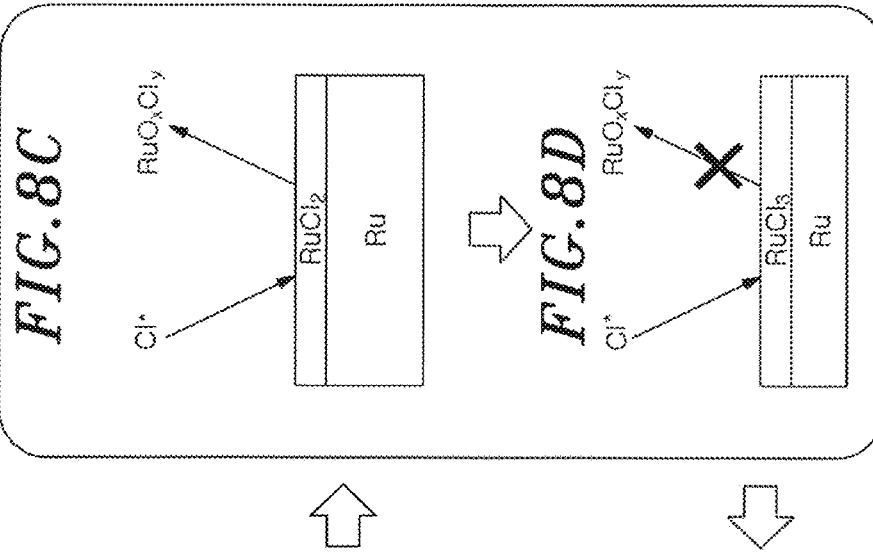
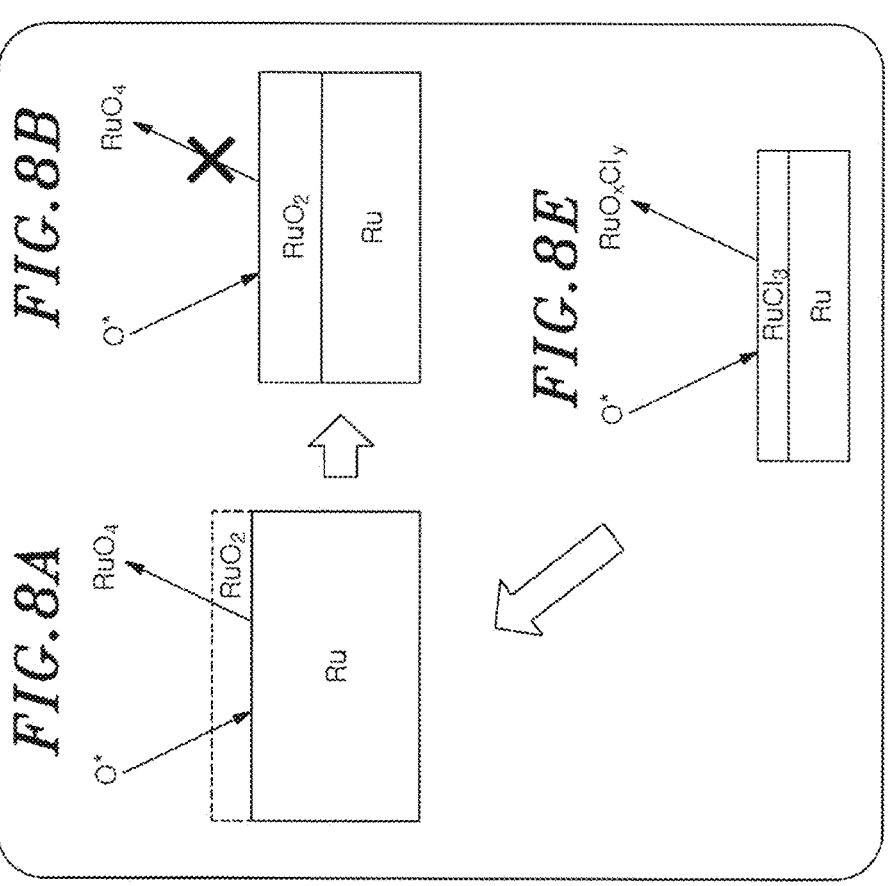

ETCHING METHOD

CROSS-REFERENCE TO RELATED APPLICATION

This application is a continuation of U.S. patent application Ser. No. 16/360,469, filed on Mar. 21, 2019, which claims priority to Japanese Patent Application No. 2018-056706 filed on Mar. 23, 2018, the entire contents of which are incorporated herein by reference.

TECHNICAL FIELD

The present disclosure relates to an etching method.

BACKGROUND

In manufacturing electronic devices, a process of etching a ruthenium film made of ruthenium (Ru) may be performed. Japanese Patent Application Publication No. H8-78396 discloses a method of etching a ruthenium film by using plasma of a mixed gas containing oxygen ($O_2$) and chlorine ($Cl_2$).

In the method disclosed in Japanese Patent Application Publication No. H8-78396, the ruthenium film is etched by using the plasma of the mixed gas. Therefore, the etching rate of the ruthenium film increases or decreases depending on the flux or energy of ions and reactive species. Accordingly, in the method of etching the ruthenium film, it is necessary to suppress the variation in the etching rate.

SUMMARY

In accordance with an aspect of the present disclosure, there is provided a method for etching a ruthenium film, including: a first step of etching the ruthenium film by plasma processing using oxygen-containing gas; and a second step of etching the ruthenium film by plasma processing using chlorine-containing gas, wherein the first step and the second step are alternately performed, and in the first step and the second step, the ruthenium film is etched at a target control temperature for a target processing time that are determined based on a pre-obtained relation between an etching amount per one cycle including the first step and the second step as a set, a control temperature of the ruthenium film, and processing times of each of the first step and the second step.

BRIEF DESCRIPTION OF THE DRAWINGS

The objects and features of the present disclosure will become apparent from the following description of embodiments, given in conjunction with the accompanying drawings, in which:

FIG. 4 is a graph showing relation between processing time and an Ru etching amount in plasma etching using oxygen-containing gas;

FIG. 7A is a graph showing relation between a surface coverage of nonvolatile chloride and the processing time in the plasma etching using the chlorine-containing gas;

FIG. 7B is a graph showing relation between the amount of generated volatile chloride and the processing time in the plasma etching using the chlorine-containing gas;

FIG. 7C is a graph showing relation between the Ru etching amount and the processing time in the plasma etching using the chlorine-containing gas;

FIGS. 8A-8E are a conceptual diagram for explaining principle of an etching method;

DETAILED DESCRIPTION

Figure 1:
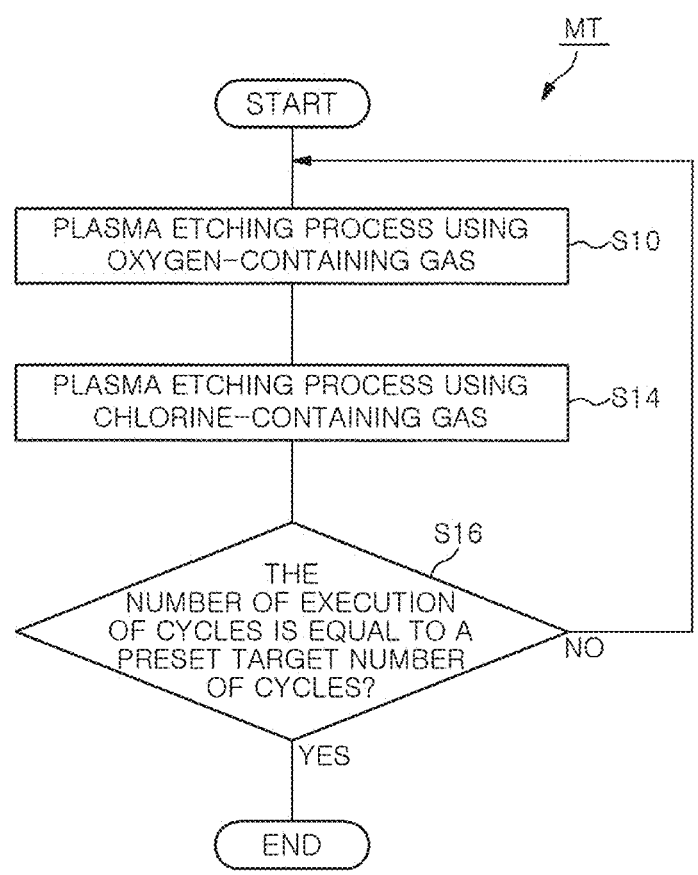
FIG. 1 is a flowchart showing an etching method according to an embodiment.

Hereinafter, embodiments will be described in detail with reference to the accompanying drawings which form a part hereof. Like reference numerals will be given to like or corresponding parts throughout the drawings.

(Outline of Etching Method)

Figure 2:
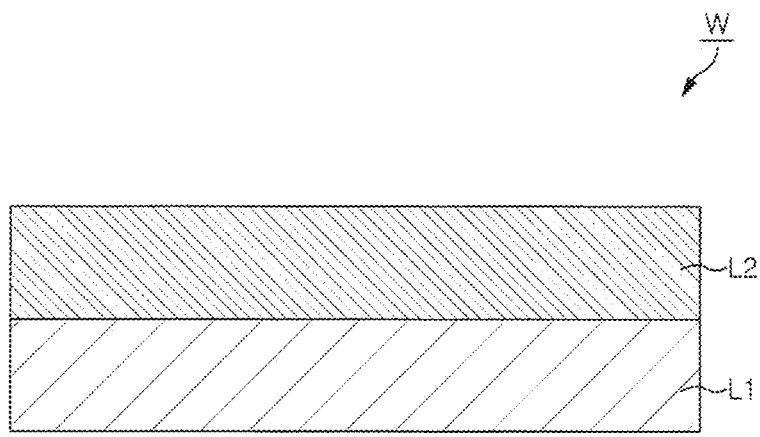
FIG. 2 is a cross sectional view of an example of a target object to which the etching method shown in FIG. 1 can be applied.

FIG. 1 is a flowchart showing an etching method according to an embodiment. The etching method shown in FIG. 1 (hereinafter referred to as "method MT") is performed to etch a ruthenium film. The ruthenium film is made of ruthenium. FIG. 2 is a cross sectional view of an example a target object to which the method MT can be applied. The target object (hereinafter referred to as "wafer W") shown in FIG. 2 includes a ruthenium film L2. The ruthenium film L2 is an etching target film. The ruthenium film L2 is formed on the substrate L1, for example.

Figure 3:
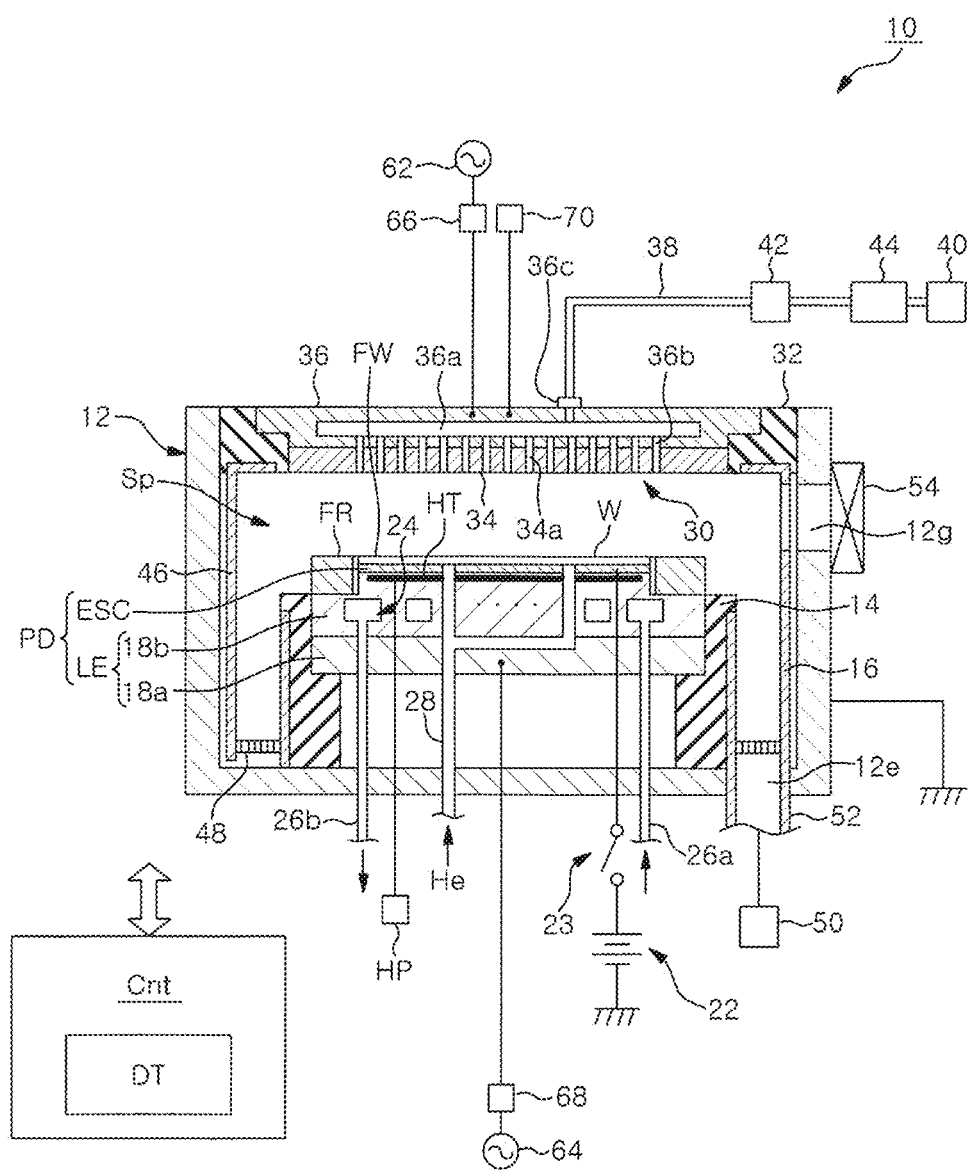
FIG. 3 illustrates a plasma processing apparatus that can be used to perform the etching method shown in FIG. 1.

The method MT is performed by using a plasma processing apparatus. FIG. 3 schematically shows an example of the plasma processing apparatus that can be used to perform the method MT. As shown in FIG. 3, the plasma processing apparatus 10 is a plasma etching apparatus including parallel plate electrodes. The plasma processing apparatus 10 includes a processing chamber 12. The processing chamber 12 has a substantially cylindrical shape and defines a processing space Sp. An inner wall surface of the processing chamber 12 is made of, e.g., anodically oxidized aluminum. The processing chamber 12 is frame grounded.

A substantially cylindrical supporting member 14 is provided on a bottom portion of the processing chamber 12. The supporting member 14 is made of, e.g., an insulating material. The insulating material forming the supporting member 14 may be an oxygen-containing material such as quartz. The supporting member 14 extends vertically from the bottom portion of the processing chamber 12 in the processing chamber 12. A mounting table PD is provided in the processing chamber 12 and supported by the supporting member 14.

The mounting table PD holds the wafer W on the top surface thereof. A main surface FW of the wafer W is opposite to the backside of the wafer W which is in contact with the top surface of the mounting table PD. The main surface FW of the wafer W faces an upper electrode 30. The mounting table PD includes a lower electrode LE and an electrostatic chuck ESC. The lower electrode LE includes a first plate 18a and a second plate 18b. The first plate 18a and the second plate 18b are made of a metal, e.g., aluminum, and have a substantially disc shape. The second plate 18b is provided on the first plate 18a, and is electrically connected to the first plate 18a.

The electrostatic chuck ESC is provided on the second plate 18b. The electrostatic chuck ESC has a structure in which an electrode of a conductive film is interposed between two insulating layers or sheets. A DC power supply 22 is electrically connected to the electrode of the electrostatic chuck ESC via a switch 23. The wafer W mounted on the mounting table PD is in contact with the electrostatic chuck ESC. The backside (the surface opposite to the main surface FW) of the wafer W is in contact with the electrostatic chuck ESC. The electrostatic chuck ESC attracts and holds the wafer W by electrostatic force such as Coulomb force or the like which is generated by a DC voltage from the DC power supply 22. Accordingly, the electrostatic chuck ESC can hold the wafer W thereon.

A focus ring FR is provided on a peripheral portion of the second plate 18b to surround the edges of the wafer W and the electrostatic chuck ESC. The focus ring FR is provided to improve etching uniformity. The focus ring FR is made of a material that is appropriately selected depending on a material of an etching target film. For example, the focus ring FR may be made of quartz.

A coolant channel 24 is formed in the second plate 18b. The coolant channel 24 constitutes a temperature control mechanism. A coolant is supplied from a chiller unit (not shown) provided outside the processing chamber 12 into the coolant channel 24 through a line 26a. The coolant supplied into the coolant channel 24 is returned to the chiller unit through a line 26b. The coolant is supplied and circulated in the coolant channel 24. By controlling a temperature of the coolant, a temperature of the wafer W held on the electrostatic chuck ESC can be controlled. The plasma processing apparatus 10 is provided with a gas supply line 28. The gas supply line 28 supplies a heat transfer gas, e.g., He gas, from a heat transfer gas supply unit to a gap between a top surface of the electrostatic chuck ESC and the backside of the wafer W.

The plasma processing apparatus 10 is provided with a temperature control unit HT for controlling the temperature of the wafer W. The temperature control unit HT is embedded in the electrostatic chuck ESC and connected to a heater power supply HP. A temperature of the electrostatic chuck ESC is controlled by supplying power from the heater power supply HP to the temperature control unit HT, such that the temperature of the wafer W held on the electrostatic chuck ESC is controlled. The temperature control unit HT may be embedded in the second plate 18b.

The temperature control unit HT includes a plurality of heating elements that emits heat, and a plurality of temperature sensors that detects ambient temperatures of the heating elements. The heating elements are respectively provided at locations corresponding to a plurality of regions of the main surface FW of the wafer W when the wafer W is position-aligned and mounted on the electrostatic chuck ESC. When the wafer W is position-aligned and mounted on the electrostatic chuck ESC, a control unit Cnt recognizes the heating elements and the temperature sensors corresponding to the regions on the main surface FW of the wafer W in correlation with the regions. The control unit Cnt can distinguish the regions, the heating elements and the temperature sensors corresponding to the regions from numbers, characters, or the like. The control unit Cnt detects a temperature of one region by a temperature sensor provided at a location corresponding to that region and controls the temperature of that region by a heating element provided at a location corresponding to that region. When the wafer W is mounted on the electrostatic chuck ESC, a temperature detected by one temperature sensor is equal to a temperature of the wafer W at a region corresponding to the one temperature sensor.

The plasma processing apparatus 10 includes the upper electrode 30. The upper electrode 30 is disposed above the mounting table PD to face the mounting table PD. The lower electrode LE and the upper electrode 30 are arranged substantially in parallel to each other and constitute parallel plate electrodes. The processing space Sp for performing plasma processing on the wafer W is provided between the upper electrode 30 and the lower electrode LE.

The upper electrode 30 is supported at an upper portion of the processing chamber 12 through an insulating shielding member 32. The insulating shielding member 32 is made of an insulating material, e.g., an oxygen-containing material such as quartz. The upper electrode 30 may include an electrode plate 34 and an electrode holder 36. The electrode plate 34 faces the processing space Sp and has a plurality of gas injection holes 34a. In one embodiment, the electrode plate 34 contains silicon. In another embodiment, the electrode plate 34 may contain silicon oxide.

The electrode holder 36 detachably holds the electrode plate 34, and may be made of a conductive material, e.g., aluminum. The electrode holder 36 may have a water-cooling structure. A gas diffusion space 36a is provided in the electrode holder 36. A plurality of gas holes 36b communicating with the gas injection holes 34a extends downward from the gas diffusion chamber 36a. A gas inlet port 36c for introducing a processing gas to the gas diffusion chamber 36a is formed at the electrode holder 36. A gas supply line 38 is connected to the gas inlet port 36c.

A gas source group 40 is connected to the gas supply line 38 through a valve group 42 and a flow rate controller group 44. The gas source group 40 includes a plurality of gas sources. The gas sources may include a source of an oxygen-containing gas and a source of a chlorine-containing gas. The oxygen-containing gas is a gas containing an oxygen atom. The oxygen-containing gas is, e.g., oxygen gas. The chlorine-containing gas is a gas containing a chlorine atom. The chlorine-containing gas is, e.g., chlorine gas. The gas sources may include a source of rare gas. As for the rare gas, any rare gas such as argon gas or helium gas can be used.

The valve group 42 includes a plurality of valves. The flow rate controller group 44 includes a plurality of flow rate controllers such as mass flow controllers. The gas sources of the gas source group 40 are respectively connected to the gas supply line 38 through corresponding valves of the valve group 42 and corresponding flow rate controllers of the flow rate controller group 44. Therefore, the plasma processing apparatus 10 can supply gases from one or more gas sources selected among the plurality of gas sources of the gas source group 40 to the processing chamber 12 at individually controlled flow rates.

In the plasma processing apparatus 10, a deposition shield 46 is detachably provided along an inner wall of the processing chamber 12. The deposition shield 46 is also provided at an outer periphery of the supporting member 14. The deposition shield 46 prevents etching by-products (deposits) from being adhered to the processing chamber 12. The deposition shield 46 may be formed by coating ceramic such as $Y_2O_3$ or the like on an aluminum base material. The deposition shield may be made of an oxygen-containing material, e.g., quartz, other than $Y_2O_3$.

At the side of the bottom portion of the processing chamber 12, a gas exhaust plate 48 is provided between the supporting member 14 and a sidewall of the processing chamber 12. The gas exhaust plate 48 may be formed by coating ceramic such as $Y_2O_3$ or the like on an aluminum base material. A gas exhaust port 12e is provided at the processing chamber 12 to be positioned below the gas exhaust plate 48. A gas exhaust unit 50 is connected to the gas exhaust port 12e through a gas exhaust line 52. The gas exhaust unit 50 includes a vacuum pump such as a turbo molecular pump or the like. The gas exhaust unit 50 can decrease a pressure in the space in the processing chamber 12 to a desired vacuum level. A loading/unloading port 12g for the wafer W is provided at the sidewall of the processing chamber 12. The loading/unloading port 12g can be opened and closed by a gate valve 54.

The plasma processing apparatus 10 further includes a first high frequency power supply 62 and a second high frequency power supply 64. The first high frequency power supply 62 generates a first high frequency power for plasma generation. The first high frequency power has a frequency ranging from 27 to 100 MHz, e.g., 60 MHz. Further, the first high frequency power supply 62 has a pulse specification, and can be controlled with a frequency of 5 to 10 kHz and a duty ratio of 50 to 100%. The first high frequency power supply 62 is connected to the upper electrode 30 via a matching unit 66. The matching unit 66 is a circuit for matching an output impedance of the first high frequency power supply 62 and an input impedance of a load side (the lower electrode LE side). The first high frequency power supply 62 may be connected to the lower electrode LE via the matching unit 66.

The second high frequency power supply 64 generates a second high frequency power, i.e., a high frequency bias power, for attracting ions to the wafer W. The second high frequency power has a frequency ranging from 400 kHz to 40.68 MHz, e.g., 13.56 MHz. Further, the second high frequency power supply 64 has a pulse specification, and can be controlled with a frequency of 5 to 40 kHz and a duty ratio of 20 to 100%. The second high frequency power supply 64 is connected to the lower electrode LE via a matching unit 68. The matching unit 68 is a circuit for matching an output impedance of the second high frequency power supply 64 and an input impedance of the load side (the lower electrode LE side).

The plasma processing apparatus 10 further includes a power supply 70. The power supply 70 is connected to the upper electrode 30. The power supply 70 applies to the upper electrode 30 a voltage for attracting positive ions in the processing space Sp to the electrode plate 34. In one example, the power supply 70 is a DC power supply that generates a negative DC voltage. When the negative DC voltage is applied from the power supply 70 to the upper electrode 30, positive ions in the processing space Sp collide with the electrode plate 34. Accordingly, secondary electrons and/or silicon are released from the electrode plate 34.

The plasma processing apparatus 10 may further include the control unit Cnt. The control unit Cnt may be a controller such as a programmable computer device. The control unit Cnt can control the respective components of the plasma processing apparatus 10 by a recipe-based program. For example, the control unit Cnt controls the selection and the flow rate of the gas supplied from the gas source group 40 by a control signal. The control unit Cnt controls the exhaust operation of the gas exhaust device 50 by a control signal. The control unit Cnt controls the power supply from the first high frequency power supply 62 and the second high frequency power supply 64 by a control signal. The control unit Cnt controls the voltage application from the power supply 70 by a control signal. The control unit Cnt controls the power supply of the heater power supply HP by a control signal. The control unit Cnt controls the flow rate and the temperature of the coolant from the chiller unit by a control signal. The steps of the method MT can be executed by operating the respective components of the plasma processing apparatus 10 under the control of the control unit Cnt. A computer program for executing the method MT and various data DT used for executing the method MT are readably stored in the storage unit of the control unit Cnt.

(Details of Etching Method)

The case in which the method MT is applied to the wafer W shown in FIG. 2 by using the plasma processing apparatus 10 will be described in detail. The method MT is executed in a state in which the wafer W is provided in the processing chamber 12 of the plasma processing apparatus 10, i.e., in the processing space Sp. In the processing space Sp, the wafer W is mounted and held on the electrostatic chuck ESC. As shown in FIG. 1, the method MT includes a step S10 (example of a first step) and a step S14 (example of a second step).

In the step S10, the control unit Cnt executes an etching of a ruthenium film L2 by plasma processing using oxygen-containing gas. In the plasma processing using oxygen-containing gas, the wafer W is processed by plasma of oxygen-containing gas. The control unit Cnt performs the plasma processing under predetermined etching conditions. The etching conditions include a target control temperature and target processing time. The target control temperature is a preset target temperature of the wafer W. The target processing time is preset target processing time of the plasma processing. The target control temperature may be 100° C. or lower. A method of determining the target control temperature and the target processing time will be described later. In the step S10, the control unit Cnt controls the heater power supply HP and the temperature control unit HT to control the temperature of the wafer W to the target control temperature. In the step S10, the control unit Cnt executes the plasma generation of oxygen gas in the processing chamber 12, i.e., in the processing space Sp. The control unit Cnt may apply the high frequency bias power for attracting ions. The control unit Cnt performs plasma etching on the wafer W for the target processing time.

In the step S14, the control unit Cnt executes an etching of the ruthenium film L2 by plasma processing using chlorine-containing gas. In the plasma processing using chlorine-containing gas, the wafer W is processed by plasma of chlorine-containing gas. The control unit Cnt executes plasma processing under predetermined etching conditions. The etching conditions include a target control temperature and target processing time. The target control temperature may be 100° C. or lower. A method of determining the target control temperature and the target processing time will be described later. In the step S14, the control unit Cnt controls the heater power supply HP and the temperature control unit HT to control the temperature of the wafer W to the target control temperature. In the step S14, the control unit Cnt executes the plasma generation of chlorine gas in the processing chamber 12, i.e., in the processing space Sp. The control unit Cnt may apply the high frequency bias power for attracting ions. The control unit Cnt performs plasma etching on the wafer W for the target processing time.

Next, in a step S16, the control unit Cnt determines whether or not the number of execution of cycles is equal to a preset target number of cycles. The number of cycles can be counted with the steps S10 and S14 as one set. For example, when the steps S10 and S14 are alternately executed once, the number of cycles is "1". For example when the steps S10 and S14 are executed alternately twice, the number of cycles is "2".

When it is determined that the number of execution of cycles is not equal to the preset target number of cycles, the control unit Cnt executes the processing from the step S10 again. When it is determined that the number of execution of cycles is equal to the preset target number of cycles, the control unit Cnt terminates the processing of the flowchart shown in FIG. 1. In accordance with the method MT, the steps S10 and S14 are executed alternately until the number of execution of cycles reaches the target number of cycles.

(Principle of Etching)

First, the principle etching in the step S10 will be explained. FIG. 4 is a graph showing relation between the Ru etching amount and the processing time in plasma etching using oxygen-containing gas. In the graph shown in FIG. 4, the horizontal axis represents the processing time, and the vertical axis represents the Ru etching amount. As shown in FIG. 4, volatile ruthenium oxide is generated on the surface of the ruthenium film by chemical reaction of the plasma of the oxygen-containing gas. The volatile ruthenium oxide may be, e.g., $RuO_3(g)$ or $RuO_4(g)$. The surface of the ruthenium film is etched due to the generation of the volatile oxide.

Further, nonvolatile ruthenium oxide is generated on the surface of the ruthenium film by chemical reaction of the plasma of the oxygen-containing gas. The nonvolatile oxide may be, e.g., $RuO_2(s)$. The nonvolatile oxide such as $RuO_2(s)$ or the like covers the surface of the ruthenium film as time elapses. When the nonvolatile oxide is generated on the surface of the ruthenium film, the area (reaction site) where the volatile oxide is generated on the surface of the ruthenium film is decreased. Since the reaction site is decreased, the generation amount of the nonvolatile oxide is decreased. For example, the Ru etching amount is not increased greatly when the processing time exceeds the time in which the surface coverage of the volatile oxide is 70%. The surface coverage is the ratio of the occupied reaction site. The chemical reaction of the plasma does not progress significantly when the processing time reaches the time in which the surface coverage is 100%. When the chemical reaction of the plasma is saturated, the etching stop occurs. Therefore, even if the processing time is increased, the Ru etching amount becomes substantially constant. In the following, the phenomenon in which the reaction site on the surface becomes substantially 0% and the reaction does not progress is referred to as "self-limiting." The processing time period in which the self-limiting occurs is referred to as "self-limiting region." The phenomenon in which the progress of the reaction slows down before the complete self-limiting occurs is referred to as "sub self-limiting." The processing time period in which the sub self-limiting occurs is referred to as "sub self-limiting region." For example, the sub self-limiting region is the processing time period in which the surface coverage is 70% to 100%.

Figure 5A:
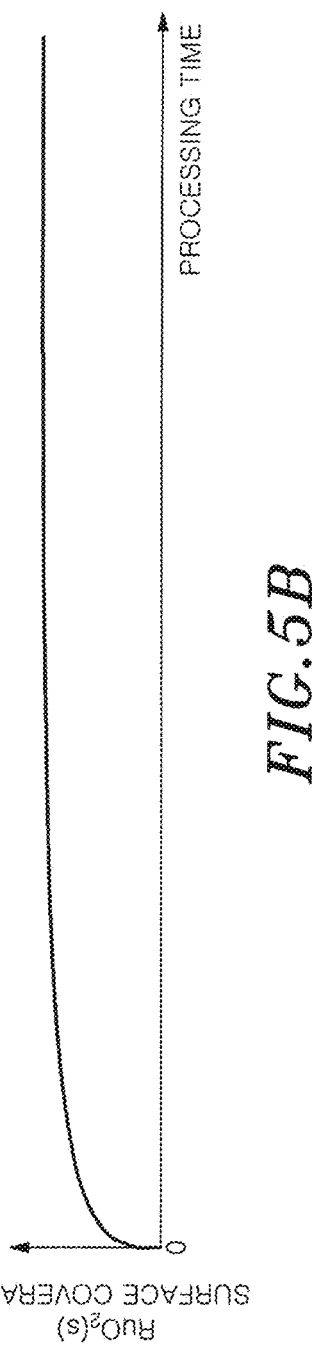
FIG. 5A is a graph showing relation between a surface coverage of nonvolatile oxide and processing time in plasma etching using oxygen-containing gas.
Figure 5B:
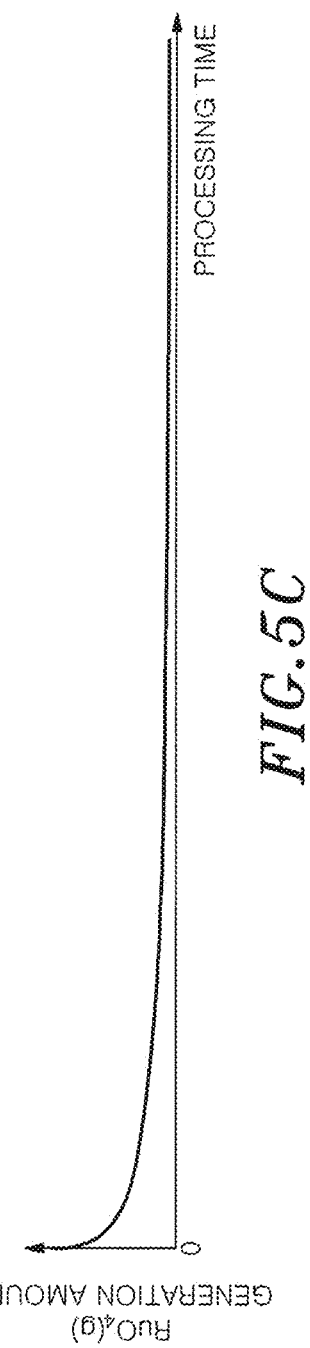
FIG. 5B is a graph showing relation between the generation amount of volatile oxide and the processing time in the plasma etching using the oxygen-containing gas.
Figure 5C:
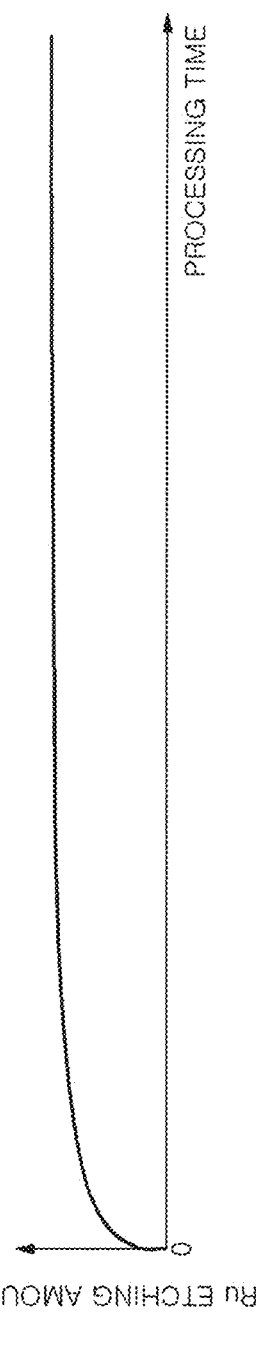
FIG. 5C is a graph showing relation between the Ru etching amount and the processing time in the plasma etching using the oxygen-containing gas.

FIGS. 5A to 5C are graphs in which the surface coverage of the nonvolatile oxide, the generation amount of the volatile oxide, and the Ru etching amount are compared. FIG. 5A is a graph showing the relation between the surface coverage of the nonvolatile oxide and the processing time in the plasma etching using oxygen-containing gas. FIG. 5B is a graph showing the relation between the generation amount of the volatile oxide and the processing time in the plasma etching using the oxygen-containing gas. FIG. 5C is a graph showing the relation between the Ru etching amount and the processing time in the plasma etching using oxygen-containing gas. In FIGS. 5A to 5C, the horizontal axis represents the processing time.

Nonvolatile oxide is generated on the surface of the ruthenium film by chemical reaction of $Ru+2O^* \rightarrow RuO_2(s)$ by the plasma of the oxygen-containing gas. At the same time, volatile oxide is generated on the surface of the ruthenium film by chemical reaction of $Ru+4O^* \rightarrow RuO_4(g)$. As shown in FIG. 5A, the surface coverage of $RuO_2(s)$ is increased as the processing time elapses. As shown in FIG. 5B, the generation amount of $RuO_4(g)$ is decreased as the surface coverage of $RuO_2(s)$ is increased. As shown in FIG. 5C, the increase in the Ru etching amount is suppressed as the generation amount of $RuO_4(g)$ is decreased. In the plasma etching using oxygen-containing gas, the etching amount per one step is limited.

Figure 6:
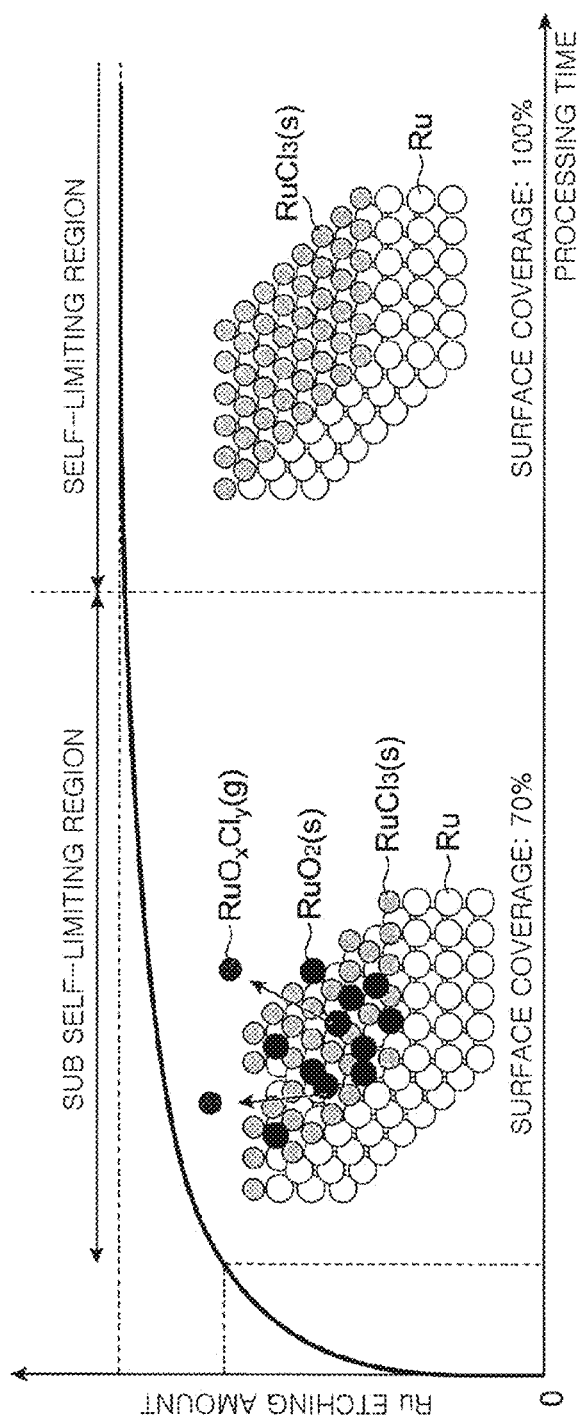
FIG. 6 is a graph showing relation between the Ru etching amount and processing time in plasma etching using chlorine-containing gas.

Next, the principle of the etching in the step S14 will be explained. FIG. 6 is a graph showing the relation between the Ru etching amount and the processing time in plasma etching using chlorine-containing gas. In the graph shown in FIG. 6, the horizontal axis represents the processing time, and the vertical axis represents the Ru etching amount. In the following, the case in which the step S10 is executed before the step S14 will be described. As shown in FIG. 6, on the surface of the ruthenium film, volatile ruthenium chloride is generated from the nonvolatile oxide by chemical reaction of the plasma of the chlorine-containing gas. The volatile chloride is, e.g., $RuO_xCl_y(g)$. The surface of the ruthenium film is etched due to the generation of the volatile chloride.

Since the nonvolatile oxide is turned into volatile chloride and evaporates, the amount of nonvolatile oxide is decreased as time elapses. Therefore, the Ru etching amount is decreased as time elapses. On the surface of the ruthenium film, nonvolatile ruthenium chloride is generated by chemical reaction of plasma of chlorine-containing gas. The nonvolatile chloride is, e.g., $RuCl_3(s)$. The nonvolatile chloride such as $RuCl_3(s)$ or the like covers the surface of the ruthenium film as time elapses. For example, the Ru etching amount is not increased considerably when the processing time that exceeds the time in which the surface coverage of the volatile chloride is 70%. The chemical reaction of the plasma does not progress significantly when the processing time reaches the time in which the surface coverage is 100%. When the chemical reaction of the plasma is saturated, the etching stop occurs. Therefore, even if the processing time is increased, the Ru etching amount becomes substantially constant. In this manner, in the plasma etching of the chlorine-containing gas, the self-limiting and the sub self-limiting occur.

FIGS. 7A to 7C are graphs in which the surface coverage of nonvolatile chloride, the generation amount of volatile chloride, and the Ru etching amount are compared. FIG. 7A is a graph showing the relation between the surface coverage of nonvolatile chloride and the processing time in plasma etching using chlorine-containing gas. FIG. 7B is a graph showing the relation between the generation amount of volatile chloride and the processing time in the plasma etching using chlorine-containing gas. FIG. 7C is a graph showing the relation between the Ru etching amount and the processing time in the plasma etching using chlorine-containing gas. In FIGS. 7A to 7C, the horizontal axis represents the processing time.

The nonvolatile oxide on the surface of the ruthenium film is turned into volatile chloride by the chemical reaction of the plasma of the chlorine-containing gas. At the same time, nonvolatile chloride is generated on the surface of the ruthenium film by the chemical reaction of the plasma of the chlorine-containing gas. As shown in FIG. 7A, the surface coverage of $RuCl_3(s)$ is increased as the processing time elapses. As shown in FIG. 7B, the generation amount of $RuO_xCl_y(g)$ is decreased as the surface coverage of $RuCl_3(s)$ is increased (as the surface coverage of $RuO_2(s)$ is decreased). As shown in FIG. 7C, the increase in the Ru etching amount is suppressed as the generation amount of $RuO_xCl_y(g)$ is decreased. In the plasma etching using chlorine-containing gas, the etching amount per one step is limited.

(Surface Renewal by Alternating Execution)

In the method MT, the steps S10 and S14 are executed alternately. By alternately executing the steps S10 and S14, an etching inhibiting factor generated in the step S10 is eliminated in the subsequent step S14. Similarly, an etching inhibiting factor generated in the step S14 is eliminated in the subsequent step S10.

FIG. 8 is a conceptual diagram for explaining the principle of the etching method. As shown in the state (A) of FIG. 8, when the step S10 is executed, nonvolatile oxide (e.g., $RuO_2$) and volatile oxide (e.g., $RuO_4$) are generated by oxygen radicals. The ruthenium film is etched due to the generation of the volatile oxide. Next, as shown in the state (B) of FIG. 8, the nonvolatile oxide covers the surface of the ruthenium film, and the generation amount of volatile oxide is decreased. Since the generation amount of volatile oxide is decreased, the Ru etching amount is decreased (self-limiting). Next, when the step S14 is executed, volatile chloride (e.g., $RuO_xCl_y$) is generated from the nonvolatile oxide by chlorine radicals as shown in the state (C) of FIG. 8. The ruthenium film is etched due to the generation of the volatile chloride. Next, as shown in the state (D) of FIG. 8, the nonvolatile oxide is removed; the nonvolatile chloride (e.g., $RuCl_3$) covers the surface of the ruthenium film; and the generation amount of volatile chloride is decreased. Since the generation amount of volatile chloride is decreased, the Ru etching amount is decreased (self-limiting). When the step S10 is executed again, the nonvolatile chloride is removed by the oxygen radicals, and the state returns to the state (A) of FIG. 8. By alternately executing the steps S10 and S14, the surface of the ruthenium film is renewed.

(Determination of Target Control Temperature and Target Processing Time)

Since the self-limiting occurs in the steps S10 and S14, the Ru etching amount per one cycle including the steps S10 and step S14 as one set becomes constant when the processing time exceeds a certain level. The processing time required until the Ru etching amount per one cycle is saturated depends on the control temperature of the ruthenium film. By previously acquiring the relation between the etching amount per one cycle, the control temperature of the ruthenium film, and the processing time of each step, the control unit Cnt can determine the target control temperature and the target control processing time which are required to obtain the target Ru etching amount per one cycle. Hereinafter, the etching amount per one cycle is referred to as "EPC (Etch per cycle)."

Figure 9:
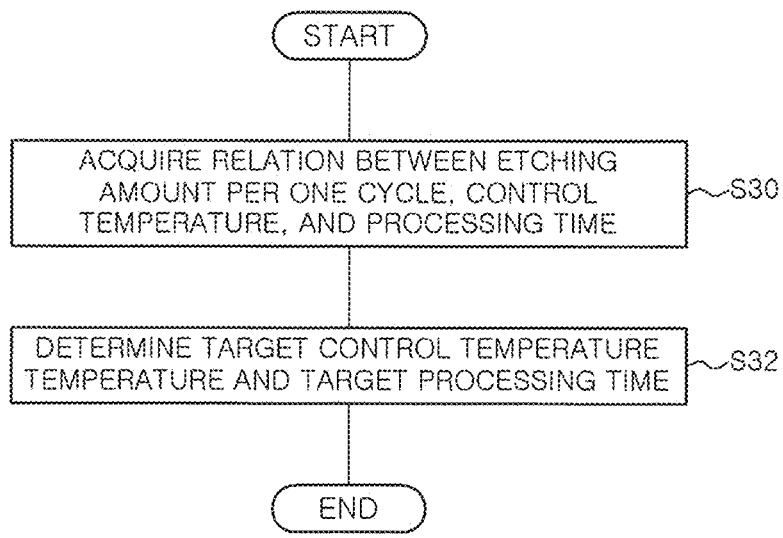
FIG. 9 is a flowchart showing an example of a method of determining a target control temperature and target processing time.

FIG. 9 is a flowchart showing an example of a method for determining the target control temperature and the target processing time. The flowchart shown in FIG. 9 is executed by, e.g., the control unit Cnt.

Figure 14:
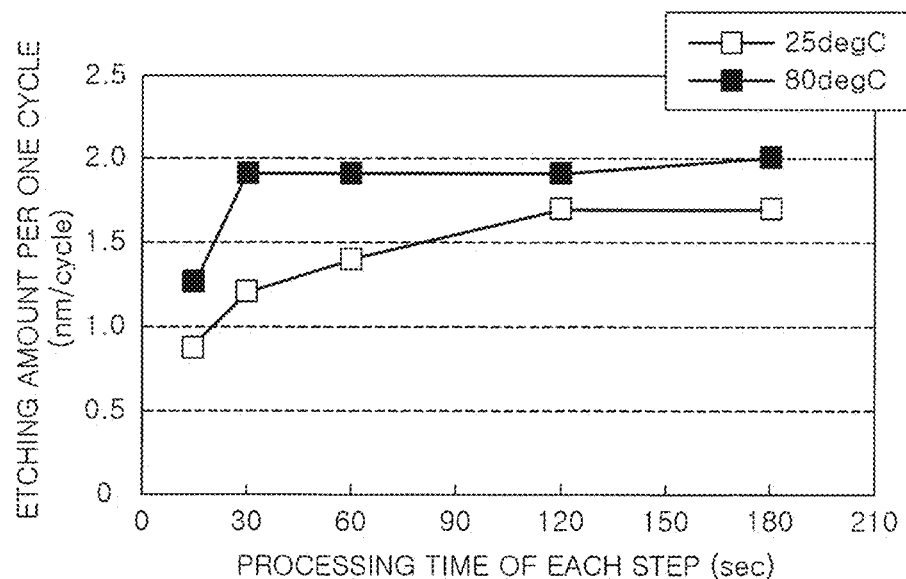
FIG. 14 shows a test result on relation between processing time of each step and the etching amount per one cycle.

In a step S30, the control unit Cnt acquires the relation between the EPC, the control temperature of the ruthenium film, and the processing time of each step. For example, as shown in FIG. 14 to be described later, the control unit Cnt acquires the relation between the processing time of each step and the EPC for each control temperature. This relation may be acquired in advance by the plasma processing apparatus 10, for example, and may be stored in the storage unit of the control unit Cnt. This relation may be acquired in advance by another plasma processing apparatus, for example, and may be stored in the storage unit of the control unit Cnt. The control unit Cnt may acquire the relation between the EPC, the control temperature of the ruthenium film, and the processing time of each step while referring to the storage unit. The control unit Cnt may acquire the relation between the EPC, the control temperature of the ruthenium film, and the processing time of each step through communication.

In a step S32, the control unit Cnt determines the target control temperature and the target processing time in the steps S10 and S14 based on the acquired relation. The control unit Cnt determines a common target control temperature and common target processing time as the target control temperature and the target processing time in the steps S10 and S14. The control unit Cnt sets the target control temperature to be within range corresponding to the previously acquired relation. The control unit Cnt sets the target control temperature to, e.g., 100° C. or lower. The control unit Cnt may set the target control temperature within a range from 25° C. to 80° C., for example. The control unit Cnt determines the processing time required until the EPC is saturated based on the set target control temperature and the above-described relation. The control unit Cnt sets the target processing time to be more than or equal to the processing time required until the EPC is saturated. In other words, the control unit Cnt sets the target processing time to be more than or equal to the processing time in which the reaction between ruthenium and oxygen is saturated and to be more than the processing time in which the reaction between ruthenium and chlorine is saturated. The control unit Cnt may independently determine the target control temperature and the target processing time in the steps S10 and S14. In that case, the control unit Cnt sets the target processing time in the step S10 to be more than or equal to the processing time in which the reaction between ruthenium and oxygen is saturated, and sets the target processing time in the step S14 to be more than or equal to the processing time in which the reaction between ruthenium and chlorine is saturated. When the step S32 is terminated, the processing of the flowchart shown in FIG. 9 is terminated.

By executing the processing of the flowchart shown in FIG. 9, in the method MT shown in FIG. 1, the etching is performed for the processing time in which the EPC is saturated (etching in self-limiting region). The method of determining the target control temperature and the target processing time is not limited to the above-described method. For example, the target control temperature and the target processing time may be determined based on the processing time period (sub self-limiting region) in which the EPC depends on the temperature.

Figure 10:
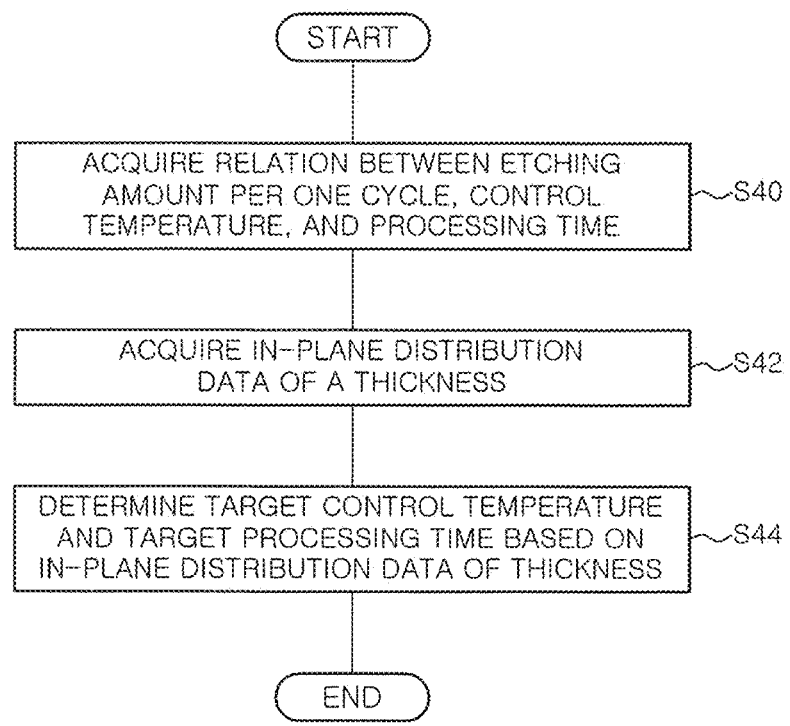
FIG. 10 is a flowchart showing another example of the method of determining a target control temperature and target processing time.

FIG. 10 is a flowchart showing another example of the method of determining the target control temperature and the target processing time. The flowchart shown in FIG. 10 is executed by, e.g., the control unit Cnt.

In a step S40, the control unit Cnt acquires the relation between the EPC, the control temperature of the ruthenium film, and the processing time of each step. The step S40 is the same as the step S30 of FIG. 9.

Figure 11A:
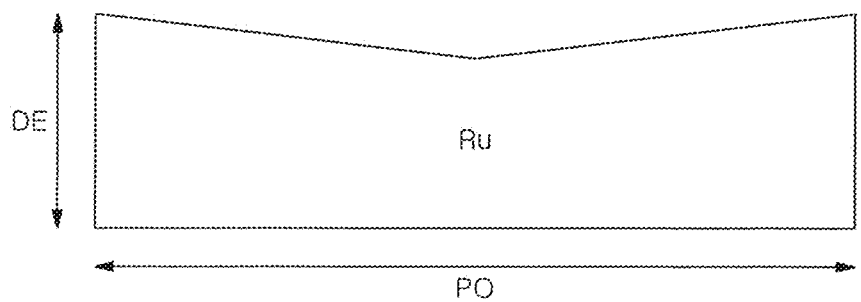
FIG. 11A explains in-plane distribution data of a ruthenium film.

In a step S42, the control unit Cnt acquires in-plane distribution data of a thickness of the ruthenium film. The in-plane distribution data indicates the distribution of the thickness for each position of the ruthenium film. FIG. 11A explains the in-plane distribution data of the ruthenium film. As shown in FIG. 11A, the thickness DE may vary depending on positions PO of the ruthenium film. The control unit Cnt acquires data in which the position PO and the thickness DE are correlated as the in-plane distribution data. The in-plane distribution data may be acquired in advance and stored in the storage unit of the control unit Cnt. In that case, the control unit Cnt acquires the in-plane distribution data while referring to the storage unit. The control unit Cnt may acquire the in-plane distribution data through communication.

Figure 11B:
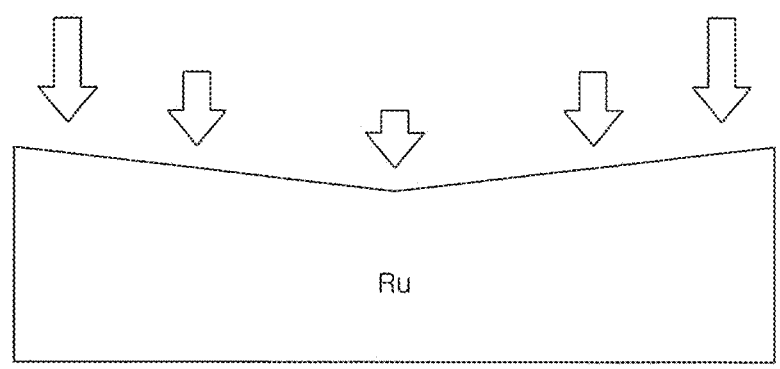
FIG. 11B explains a target etching rate for each position on the ruthenium film.

In a step S44, the control unit Cnt determines the target control temperature and the target processing time in the steps S10 and S14 based on the in-plane distribution data of the thickness and the relation acquired in the step S40. Specifically, the control unit Cnt determines the target etching rate for each position of the ruthenium film based on the in-plane distribution data of the thickness so that the thickness of the ruthenium film becomes uniform. FIG. 11B explains the target etching rate for each position of the ruthenium film. In FIG. 11B, the target etching rate is expressed by the length of the arrow. As shown in FIG. 11B, when the thickness is greater near the edge than at the central position, the etching rate near the edge is determined to be greater than that at the central portion. Accordingly, the thickness of the ruthenium film can become uniform. Next, the control unit Cnt determines the target processing time. The control unit Cnt determines the target processing time to be less than or equal to the processing time in which the reaction between ruthenium and oxygen is saturated and to be less than or equal to the processing time in which the reaction between ruthenium and chlorine is saturated. In that case, the etching amount is controlled in the semi-self-limiting region. Next, the control unit Cnt determines the target control temperature for each position which is required to obtain the target etching rate for each position, based on the target processing time and the relation acquired in the step S40. The control unit Cnt may independently determine the target control temperature and the target processing time in the steps S10 and S14. In that case, the control unit Cnt sets the target processing time in the step S10 to be less than or equal to the processing time in which the reaction between ruthenium and oxygen is saturated and/or the target processing time in step S14 to be less than or equal to the processing time in which the reaction between ruthenium and chlorine is saturated. Accordingly, in at least one of the step S10 and S14, the etching amount is controlled in the semi-self-limiting region. When the step S44 is terminated, the processing of the flowchart shown in FIG. 10 is terminated.

Figure 11C:
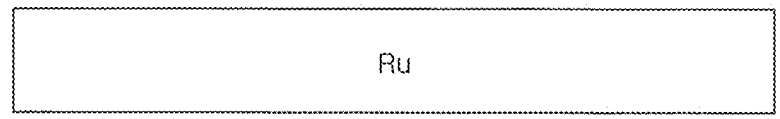
FIG. 11C shows a ruthenium film that is etched based on the in-plane distribution data.

By executing the processing of the flowchart shown in FIG. 10, in the method MT shown in FIG. 1, the etching is performed within the processing time in which the EPC is saturated and in a state where the in-plane temperature distribution of the ruthenium film is controlled (etching in sub self-limiting region). Accordingly, etching with excellent in-plane uniformity can be performed as shown in FIG. 11C.

(Another Example of Etching Method)

Figure 12:
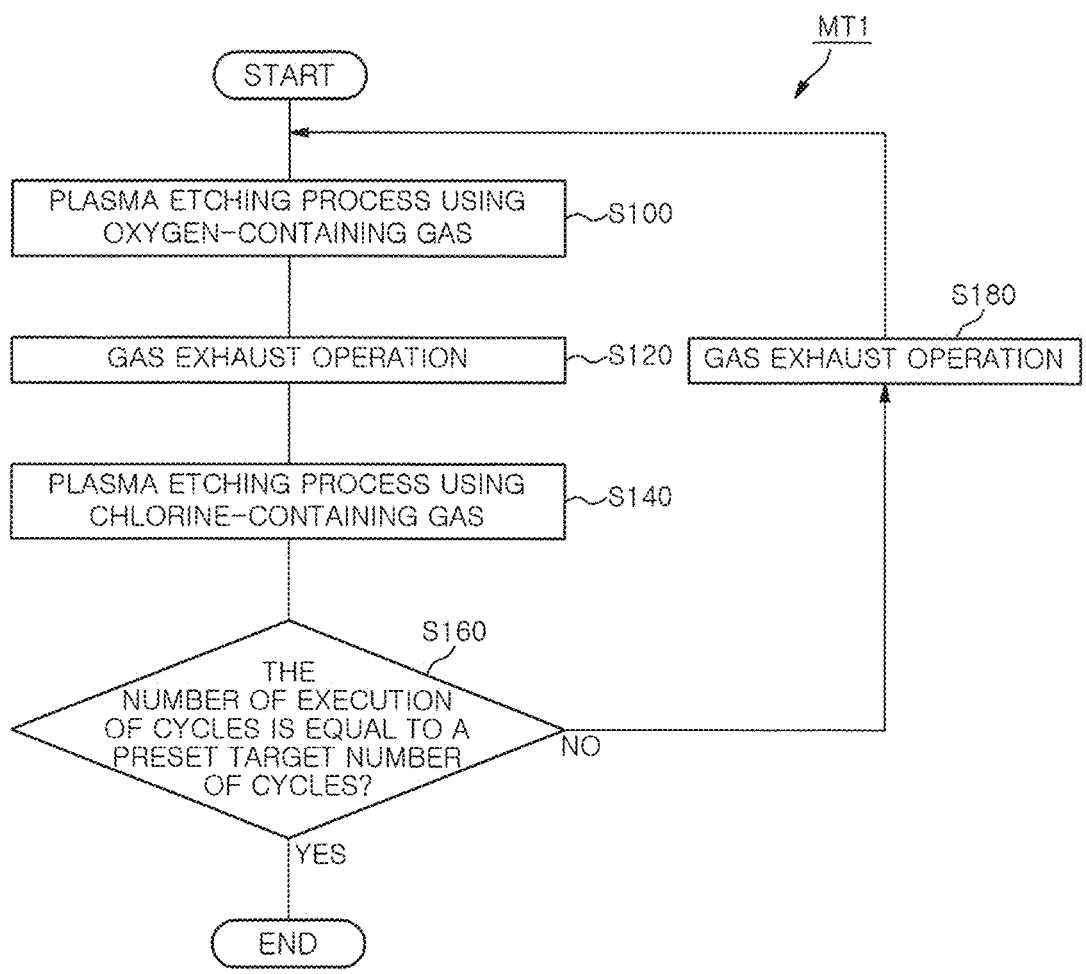
FIG. 12 is a flowchart showing an etching method according to a modified embodiment.

The method MT can be variously modified. FIG. 12 is a flowchart showing an etching method according to a modified embodiment. The etching method shown in FIG. 12 (hereinafter referred to as "method MT1") is performed to etch the ruthenium film. The method MT1 is the same as the method MT except that it includes a gas exhaust operation.

The method MT1 is executed in a state in which the wafer W is provided in the processing chamber 12 of the plasma processing apparatus 10, i.e., in the processing space Sp. In the processing space Sp, the wafer W is mounted and held on the electrostatic chuck ESC. As shown in FIG. 12, the method MT1 includes a step S100 (example of a first step) and a step S140 (example of a second step). In the step S100, the control unit Cnt etches a ruthenium film L2 by plasma processing using oxygen-containing gas. The step S100 is the same as the step S10 in FIG. 1.

In a step S120, the control unit Cnt waits until the oxygen-containing gas is exhausted from the processing space Sp (gas exhaust operation).

Next, in the step S140, the control unit Cnt etches the ruthenium film L2 by plasma processing using chlorine-containing gas. The step S140 is the same as the step S14 in FIG. 1.

Next, in a step S160, the control unit Cnt determines whether or not the number of execution of cycles is equal to a preset target number of cycles. The step S160 is the same as the step S16 in FIG. 1. When the control unit Cnt determines that the number of execution of cycles is not equal to the preset target number of cycles, the control unit Cnt waits in the step S180 until the chlorine-containing gas is exhausted from the processing space Sp (gas exhaust operation). Then, the control unit Cnt executes the processing from the step S100 again. When the number of execution of cycles is equal to the preset target number of cycles, the control unit Cnt terminates the processing of the flowchart shown in FIG. 12. In accordance with the method MT1, the steps S10 and S14 are alternately executed until the number of execution of cycles reaches the target number of cycles, and the gas exhaust operation is performed between the step S10 and the step S14.

Summary of Embodiment

In accordance with the method MT, the oxygen-containing gas and the chlorine-containing gas are alternately used and, thus, the etching rate does not depend on the plasma distribution of the mixed gas. Accordingly, the variation in the etching rate can be suppressed. Further, in accordance with the method MT, the etching rate of the ruthenium film can be accurately controlled based on new knowledge. The new knowledge is that, when the ruthenium film is subjected to plasma etching using the oxygen-containing gas and the chlorine-containing gas, the etching amount per one cycle including the steps S10 and S14 as one set can be accurately controlled by using the control temperature of the ruthenium film and the processing time of each step. In other words, it is possible to determine the target control temperature and the target processing time which are required to obtain the target etching amount by using the previously acquired relation between the etching amount per one cycle, the control temperature of the ruthenium film, and the processing time of each step. Therefore, in accordance with the method MT, the variation in the etching rate can be further suppressed by etching the ruthenium film at the target control temperature for the target processing time which are determined based on the new knowledge. In addition, the etching accuracy can be improved by increasing the EPC at the initial stage of the etching and decreasing the EPC at the final stage of the etching based on the relation between the processing time of each step and the etching amount per one cycle. In this manner, the processing time and the control temperature can be used as control parameters of the etching amount.

In accordance with the method MT, the etching stop can occur in the steps S10 and S14 by setting the target control time at a certain target control temperature to the processing time in the self-limiting region. Therefore, in accordance with the method MT, the etching amount per one cycle can be controlled to be constant.

In accordance with the method MT, the etching rate for each position in the plane of the ruthenium film can vary by controlling the in-plane temperature distribution of the ruthenium film based on the in-plane distribution data of the thickness. Therefore, in accordance with this etching method, it is possible to maintain the in-plane uniformity of the etching rate and suppress the deterioration of the in-plane uniformity of the thickness of the residual film after the etching which is caused by the non-uniformity of the initial film thickness of the ruthenium film.

In accordance with the method MT1, it is possible to prevent the gas in the previous step from remaining. While various embodiments have been described above, various modifications can be made without being limited to the above-described embodiments. For example, the method MT may be performed by using any plasma processing apparatus, such as an inductively coupled plasma processing apparatus that excites a gas by using a surface wave such as a microwave. In the method MT, any one of the steps S10 and S14 may be executed first.

Hereinafter, various tests that have been performed to evaluate the method MT will be described. The present disclosure is not limited to the following tests.

(Checking of Etching Stop)

The ruthenium film was etched by using a processing gas in which the ratio of oxygen gas and chlorine gas was varied. The plasma processing was performed under the following conditions.

First high frequency power: 100 MHz, 50 W
  Pressure in the processing space Sp: 1.33 Pa (10 mTorr)
  Flow rate ratio of gases in the processing gas
  $Cl_2/O_2$ ratio: 0% to 100%
  Control temperature of the wafer W: 25° C.

Figure 13:
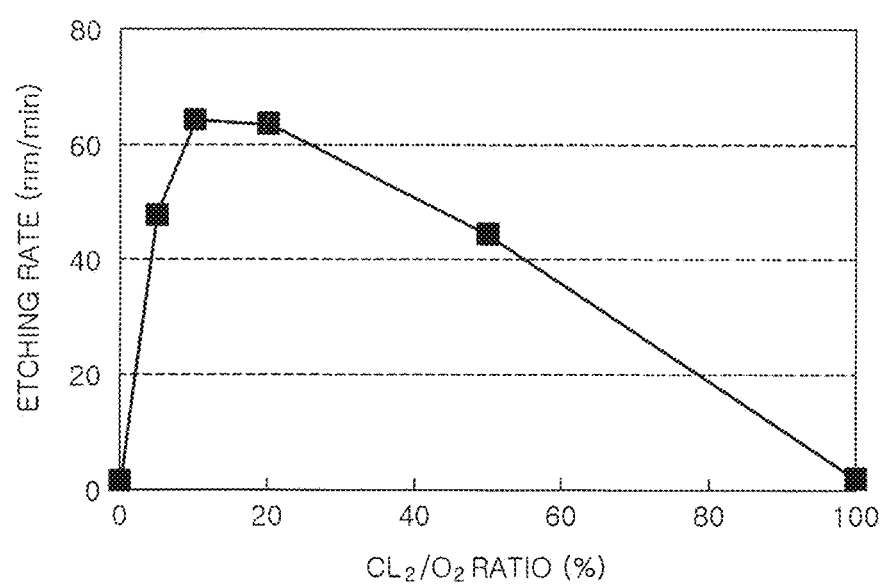
FIG. 13 shows a test result on relation between an etching rate and a ratio of chlorine and oxygen.

The etching rate of the ruthenium film was measured while varying the ratio of oxygen gas and chlorine gas in the processing gas. The result thereof is shown in FIG. 13. FIG. 13 shows the test result on the relation between the ratio of chlorine and oxygen and the etching rate. The horizontal axis represents $Cl_2/O_2$ ratio (%), and the vertical axis represents the etching rate (nm/min). As shown in FIG. 13, the etching rate was highest when the mixing ratio was within a range from 10% to 20%. The etching rate of the ruthenium film was 0 (nm/min) when the mixing ratio was 0% (i.e., $O_2$ gas alone) and when the mixing ratio was 100% (i.e., $Cl_2$ gas alone). Therefore, the etching stop occurred in the step S10 (etching using oxygen-containing gas) and the step S14 (etching using chlorine-containing gas) in the method MT.

(Checking of Self-Limiting)

The ruthenium film was etched while varying the processing time of the steps S10 and S14 in the method MT. The plasma processing was performed under the following conditions.

<Step S10>
  First high frequency power: 100 MHz, 50 W
  Pressure in the processing space Sp: 1.33 Pa (10 mTorr)
  Processing gas: $O_2$
  Flow rate of the processing gas: 200 sccm
  Control temperature of the wafer W: 25° C., 80° C.
  Processing time: 15 sec to 180 sec
  <Step S14>
  First high frequency power: 100 MHz, 50 W
  Pressure of the processing space Sp: 1.33 Pa (10 mTorr)
  Processing gas: $Cl_2$
  Flow rate of the processing gas: 200 sccm
  Control temperature of the wafer W: 25° C., 80° C.
  Processing time: 15 sec to 180 sec
  <Number of Cycles>
  Five times The etching amount per one cycle was measured for each processing time of the steps S10 and S14. The processing time and the control temperature in the step S10 were the same as those in the step S14. The result thereof is shown in FIG. 14. FIG. 14 shows the test result on the relation between the processing time of each step and the etching amount per one cycle. The horizontal axis represents the processing time (sec) of each step, and the vertical axis represents EPC (nm/cycle). As shown in FIG. 14, at the control temperature of 25° C., when the processing time was 120 sec or more, the etching amount per one cycle became substantially constant and the self-limiting occurred. At the control temperature of 80° C., when the processing time was 30 sec or more, the etching amount per one cycle became substantially constant and the self-limiting occurred. From the above, it is clear that the self-limiting in which the etching amount of the ruthenium film becomes constant occurs at the control temperature of 25° C. and 80° C. Further, it is clear that the etching amount of the ruthenium film depends on the temperature during the processing time in which the self-limiting occurs, i.e., in the sub self-limiting region. In this manner, the etching amount can be changed within the self-limiting range by changing the processing time and the control temperature in the sub self-limiting region.

(Checking of in-Plane Uniformity)

The ruthenium film was etched by the method MT. The plasma processing was performed under the following conditions.

Figure 15:
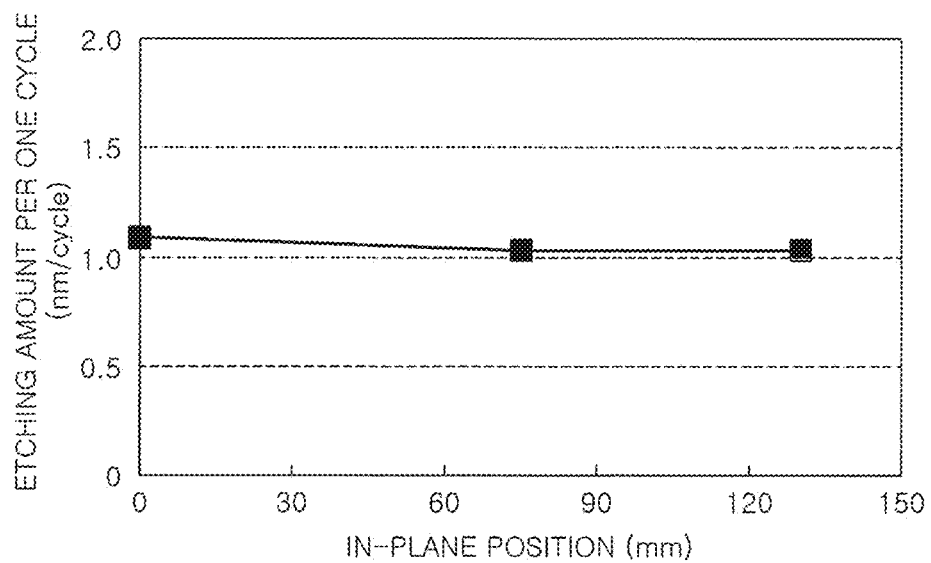
FIG. 15 shows a test result on relation between an in-plane position and the etching amount per one cycle.

<Step S10>
  First high frequency power: 100 MHz, 50 W
  Pressure in the processing space Sp: 1.33 Pa (10 mTorr)
  Processing gas: $O_2$
  Flow rate of the processing gas: 200 sccm
  Control temperature of the wafer W: 25° C.
  Processing time: 120 sec \<Step S14>
First high frequency power: 100 MHz, 50 W
Pressure in the processing space Sp: 1.33 Pa (10 mTorr)
Processing gas: $Cl_2$
Flow rate of the processing gas: 200 sccm
Control temperature of the wafer W: 25° C.
Processing time: 120 sec
\<Number of Cycles>
15 times The etching amount per one cycle was checked for each position in the plane of the wafer W. The result thereof is shown in FIG. 15. FIG. 15 shows the test result on the relation between the in-plane position and the etching amount per one cycle. The horizontal axis represents the in-plane position (mm), and the vertical axis represents the etching amount per one cycle (nm/cycle). The in-plane position is set with the center of the wafer W as the origin. As shown in FIG. 15, the etching amount was substantially the same at the center (0 mm), an intermediate position (67.5 mm), and the edge (135 mm) of the wafer W. In other words, the in-plane variation in the etching rate was suppressed by executing the steps S10 and S14 alternately.

(Checking of Processing Uniformity for Each Cycle)

The ruthenium film was etched while varying the number of cycles of the steps S10 and S14 in the method MT. The plasma processing was performed under the following conditions.

Figure 16:
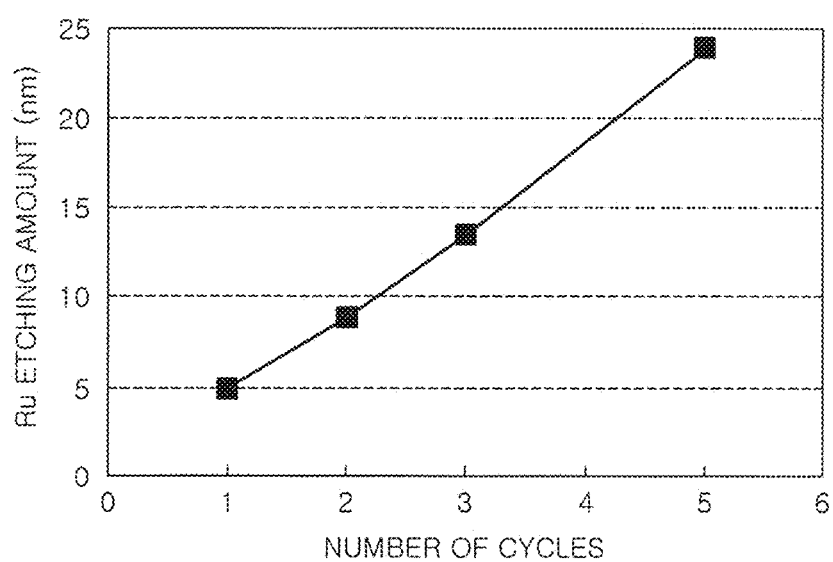
FIG. 16 shows a test result on relation between the number of cycles and the Ru etching amount.

\<Step S10>
First high frequency power: 100 MHz, 50 W
Pressure in the processing space Sp: 1.33 Pa (10 mTorr)
Processing gas: $O_2$
Flow rate of the processing gas: 200 sccm
Control temperature of the wafer W: 25° C.
Processing time: 120 sec
\<Step S14>
First high frequency power: 100 MHz, 50 W
Pressure in the processing space Sp: 1.33 Pa (10 mTorr)
Processing gas: $Cl_2$
Flow rate of the processing gas: 200 sccm
Control temperature of the wafer W: 25° C.
Processing time: 120 sec
\<Number of Cycles>
1 to 5 times The etching amount per one cycle was measured for every cycle. The result thereof is shown in FIG. 16. FIG. 16 shows the test result on the relation between the number of cycles and the Ru etching amount. The horizontal axis represents the number of cycles, and the vertical axis represents the etching amount. As shown in FIG. 16, the etching amount was linearly increased in proportion to the number of cycles. In other words, the etching amount in each cycle was constant (EPC in each cycle was constant).

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A method for etching a ruthenium film, comprising:
performing a first step of etching the ruthenium film by plasma processing using oxygen-containing gas; and
performing a second step of etching the ruthenium film using chlorine-containing gas,
wherein the first step and the second step are alternately performed, and
wherein the performing the first step and the performing the second step comprise:
(i) obtaining data indicating a relationship between an etching amount per cycle, temperature and process time for the first step and the second step;
(ii) selecting one variable from among three variables including the etching amount per cycle, the temperature or the process time for the first step and the second step;
(iii) in response to the selected one variable and the obtained data indicating the relationship, the other two variables from among the etching amount per cycle, the temperature or the process time are determined; and
(iv) performing the first step and the second step with the selected one variable and the other two variables which are determined,
wherein the selecting one variable includes selecting an etching amount per cycle, and based on the obtained data indicating the relationship, the temperature is determined as a temperature at which the etching amount per cycle is reached at a process time equal to or more than a time at which a reaction between ruthenium and oxygen is saturated in the first step, and at which the etching amount per cycle is reached at a process time equal to or more than a time at which a reaction between ruthenium and chlorine is saturated in the second step.

2. The method of claim 1, wherein the first step and the second step are repeated alternately, and the temperature and process time are determined to provide a constant etch rate for each cycle.

3. A method for etching a ruthenium film, comprising:
performing a first step of etching the ruthenium film by plasma processing using oxygen-containing gas; and
performing a second step of etching the ruthenium film using chlorine-containing gas,
wherein the first step and the second step are alternately performed, and
wherein the performing the first step and the performing the second step comprise:
(i) obtaining data indicating a relationship between an etching amount per cycle, temperature and process time for the first step and the second step;
(ii) selecting one variable from among three variables including the etching amount per cycle, the temperature or the process time for the first step and the second step;
(iii) in response to the selected one variable and the obtained data indicating the relationship, the other two variables from among the etching amount per cycle, the temperature or the process time are determined; and
(iv) performing the first step and the second step with the selected one variable and the other two variables which are determined,
wherein the selecting one variable includes selecting the temperature, and the process time for the first step is determined as a time equal to or greater than a time at which a reaction between ruthenium and oxygen is saturated in the first step for the selected temperature based on the obtained data, and the process time for the second step is determined as a time equal to or greater than a time at which a reaction between ruthenium and chlorine is saturated in the second step for the selected temperature based on the obtained data, and the etching amount for each cycle is determined based on the obtained data, the selected temperature and the determined process times.

4. The method of claim 3, wherein the process time for the first step is independently determined from the process time of the second step.

5. A method for etching a ruthenium film, comprising:
performing a first step of etching the ruthenium film by plasma processing using oxygen-containing gas; and
performing a second step of etching the ruthenium film using chlorine-containing gas,
wherein the first step and the second step are alternately performed, and
wherein the performing the first step and the performing the second step comprise:
(i) obtaining data indicating a relationship between an etching amount per cycle, temperature and process time for the first step and the second step;
(ii) selecting one variable from among three variables including the etching amount per cycle, the temperature or the process time for the first step and the second step;
(iii) in response to the selected one variable and the obtained data indicating the relationship, the other two variables from among the etching amount per cycle, the temperature or the process time are determined; and
(iv) performing the first step and the second step with the selected one variable and the other two variables which are determined,
wherein the data obtained includes information indicating saturation times at which a reaction between ruthenium and oxygen is saturated for corresponding plural temperatures, and saturation times at which a reaction between ruthenium and chlorine is saturated for corresponding plural temperatures.

6. The method of claim 5, further including selecting a first temperature and performing the first step for a process time equal to or greater than a corresponding saturation time of the obtained data for the first temperature, and selecting a second temperature and performing the second step for a process time equal to or greater than a corresponding saturation time of the obtained data for the second temperature.

* * * * *